(12) United States Patent
Tan et al.

(10) Patent No.: US 11,742,212 B2
(45) Date of Patent: Aug. 29, 2023

(54) DIRECTIONAL DEPOSITION IN ETCH CHAMBER

(71) Applicant: Lam Research Corporation, Fremont, CA (US)

(72) Inventors: Zhongkui Tan, Fremont, CA (US); Lisi Xie, Fremont, CA (US); Yoko Yamaguchi, Union City, CA (US); Yasushi Ishikawa, Fremont, CA (US); Patrick Ponath, San Jose, CA (US); Sung Jin Jung, Pleasanton, CA (US); Sangjun Park, Fremont, CA (US); Wonchul Lee, Pleasanton, CA (US); Jayoung Choi, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/309,188

(22) PCT Filed: Oct. 29, 2019

(86) PCT No.: PCT/US2019/058631
§ 371 (c)(1),
(2) Date: May 4, 2021

(87) PCT Pub. No.: WO2020/096817
PCT Pub. Date: May 14, 2020

(65) Prior Publication Data
US 2022/0028697 A1    Jan. 27, 2022

Related U.S. Application Data

(60) Provisional application No. 62/755,846, filed on Nov. 5, 2018.

(51) Int. Cl.
*H01L 21/311*    (2006.01)
*H01J 37/32*    (2006.01)
(Continued)

(52) U.S. Cl.
CPC .. *H01L 21/31144* (2013.01); *H01J 37/32449* (2013.01); *H01J 37/32724* (2013.01); *H01L 21/0276* (2013.01); *H01L 21/02274* (2013.01)

(58) Field of Classification Search
CPC ............ H01L 21/31144; H01L 21/0276; H01J 37/32449; H01J 37/32724
See application file for complete search history.

(56) References Cited

U.S. PATENT DOCUMENTS 9,673,058 B1    6/2017   Briggs et al.
10,490,415 B2 *  11/2019  Imamura ........... H01L 21/31138
(Continued)

FOREIGN PATENT DOCUMENTS

JP      H05-265189      10/1993

OTHER PUBLICATIONS

PCTUS2019058631, International Preliminary Report on Patentability, dated May 20, 2021, 8 pages.
(Continued)

*Primary Examiner* — Binh X Tran
(74) *Attorney, Agent, or Firm* — Weaver Austin Villeneuve & Sampson LLP

(57) ABSTRACT

Methods for forming a vertical growth mask for use in etching applications are described herein. Disclosed embodiments include introducing a tungsten-containing deposition precursor and one or more carrier gases while igniting a plasma to deposit tungsten selectively on field regions of positive features of a patterned etch mask without substantial deposition on sidewalls of the positive features or on an exposed surface of a target layer underlying the patterned etch mask.

14 Claims, 8 Drawing Sheets

(51) Int. Cl.
*H01L 21/02* (2006.01)
*H01L 21/027* (2006.01)

(56) References Cited

U.S. PATENT DOCUMENTS

| | | | |
|---|---|---|---|
| 2002/0192976 A1* | 12/2002 | Trapp | H01L 21/3086 |
| | | | 257/E21.546 |
| 2004/0121597 A1 | 6/2004 | Chung | |
| 2006/0160366 A1 | 7/2006 | Lu et al. | |
| 2009/0143890 A1* | 6/2009 | Morisawa | C23C 16/4405 |
| | | | 700/108 |
| 2014/0011358 A1 | 1/2014 | Chen et al. | |
| 2014/0170853 A1 | 6/2014 | Shamma et al. | |
| 2015/0170961 A1 | 6/2015 | Romero et al. | |
| 2019/0074191 A1* | 3/2019 | Nagatomo | H01L 21/31144 |
| 2019/0348288 A1* | 11/2019 | Franke | H01L 21/31116 |
| 2020/0075319 A1* | 3/2020 | Chang | H01L 21/0228 |

OTHER PUBLICATIONS

PCT International Search Report and Written Opinion dated Feb. 20, 2020, issued in Application No. PCT/US2019/058631.

\* cited by examiner

DIRECTIONAL DEPOSITION IN ETCH CHAMBER

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes.

BACKGROUND

Semiconductor device fabrication includes fabrication of microprocessors, logic, and memory devices. Such devices may be fabricated using a variety of techniques, including patterning techniques implementing masks of various types. Some processes involve formation of structures that include silicon oxide and silicon nitride. Some techniques for forming such structures may be limited to patterning techniques that include both etch and deposition.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Provided herein are methods and apparatuses for processing semiconductor substrates. One aspect involves a method involving: providing a semiconductor substrate having a patterned etch mask over a target layer, the patterned etch mask including spaced apart positive features, each spaced apart positive feature having a field region and sidewalls; and depositing a vertical growth mask selectively on the field regions of the spaced apart positive features relative to the target layer.

In various embodiments, the vertical growth mask includes at least one feature; and critical dimension of the at least one feature of the vertical growth mask is substantially the same as critical dimension of a corresponding spaced apart positive feature of the patterned etch mask.

In some embodiments, depositing the vertical growth mask on the field regions is performed at a substrate temperature between about 0° C. and about 160° C.

The method may also include etching the target layer using both the patterned etch mask and the vertical growth mask as a mask. In some embodiments, the depositing of the vertical growth mask and the etching of the target layer are performed simultaneously. In some embodiments, depositing and the etching are performed simultaneously by exposing the semiconductor substrate to a fluorocarbon gas and a tungsten-containing gas and igniting a plasma. The fluorocarbon gas and tungsten-containing gas may be delivered in a ratio of fluorocarbon gas flow rate to tungsten-containing gas flow rate between about 10:1 and about 1:1. In some embodiments, the fluorocarbon gas is delivered at a flow rate less than about 80% of total volume of fluorocarbon gas and tungsten-containing gas delivered.

In some embodiments, the target layer includes amorphous carbon and the depositing and the etching are performed simultaneously by exposing the semiconductor substrate to oxygen plasma and a tungsten-containing plasma simultaneously.

In some embodiments, the method may further include alternating between depositing the vertical growth mask selectively and etching the target layer in cycles. In some embodiments, the target layer includes amorphous carbon and the etching is performed by exposing the target layer to oxygen plasma.

In various embodiments, size of spaces between spaced apart positive features of the vertical growth mask are substantially the same as size of spaces between the spaced apart positive features of the patterned etch mask. In some embodiments, the size of spaces between the spaced apart positive features of the patterned etch mask is within about 100% of the size of spaces between the spaced apart positive features of the vertical growth mask.

In various embodiments, spaces between the spaced apart positive features have an aspect ratio between about 50:1 and about 100:1.

in various embodiments, size of spaces between two adjacent spaced apart positive features is between about 10 nm and about 200 nm.

In various embodiments, depositing the vertical growth mask selectively on the field regions includes exposing the field regions to a tungsten-containing gas. In some embodiments, the tungsten-containing gas is delivered with a dilution gas. The dilution gas may be any one or more of argon gas, hydrogen gas, and mixtures thereof. The tungsten-containing gas may be a tungsten halide. In some embodiments, the tungsten halide is selected from the group consisting of tungsten hexafluoride and tungsten hexachloride. In some embodiments, depositing the vertical growth mask selectively on the field regions further includes igniting a plasma in an environment including the tungsten-containing gas. The plasma may be generated at a plasma power between about 100 W and about 500 W.

In various embodiments, depositing the vertical growth mask selectively on the field regions is performed in a process chamber having a chamber pressure between about 10 mTorr and about 100 mTorr.

In various embodiments, depositing the vertical growth mask selectively on the field regions is performed by modulating a process condition such as plasma power, chamber pressure, or substrate temperature.

In various embodiments, the patterned etch mask is between about 5 nm and about 200 nm thick.

In various embodiments, the patterned etch mask includes material selected from the group consisting of silicon oxide, silicon nitride, silicon oxynitride, and combinations thereof.

In various embodiments, the patterned etch mask includes photoresist. The target layer may be an anti-reflective coating. In various embodiments, the target layer is between about 500 nm and about 5000 nm thick.

Another aspect involves a method including: providing a semiconductor substrate having a patterned etch mask over a target layer, the patterned etch mask including spaced apart positive features, each spaced apart positive feature having a field region and sidewalls; and depositing a vertically selectively grown tungsten-containing mask on the field regions of the spaced apart positive features relative to target layer.

Another aspect involves a method including: providing a semiconductor substrate including a carbon-containing target layer, an anti-reflective layer, and a patterned photoresist; patterning the anti-reflective layer to form a patterned anti-reflective mask; exposing the semiconductor substrate to a tungsten-containing precursor and igniting a plasma under conditions to selectively deposit a tungsten-containing mask to form a patterned tungsten-containing mask on field regions of the patterned anti-reflective mask; and patterning the carbon-containing target layer using the patterned anti-reflective mask and patterned tungsten-containing mask.

Another aspect involves a method including: providing a semiconductor substrate including a target layer and a patterned etch mask having a first critical dimension; and exposing the semiconductor substrate to plasma generated using a plasma power between about 100 W and about 500 W from a tungsten-containing precursor and a mixture of argon and hydrogen gas at a substrate temperature less than about 160° C. to form tungsten material having a second critical dimension on the patterned etch mask, such that the second critical dimension is within 150% of the first critical dimension.

Another aspect involves an apparatus including: a reaction chamber including a pedestal for holding a substrate; a plasma source coupled to the reaction chamber and configured to generate a plasma; one or more first gas inlets coupled to the reaction chamber; a second gas inlet coupled to the reaction chamber; and a controller including instructions for performing the following operations: causing introduction of a tungsten-containing precursor and a mixture of argon and hydrogen gas; causing generation of the plasma using a plasma power between about 100 W and about 500 W; and causing temperature of the pedestal to be set to less than about 160° C.

These and other aspects are described further below with reference to the drawings.

DETAILED DESCRIPTION

Figure 1:
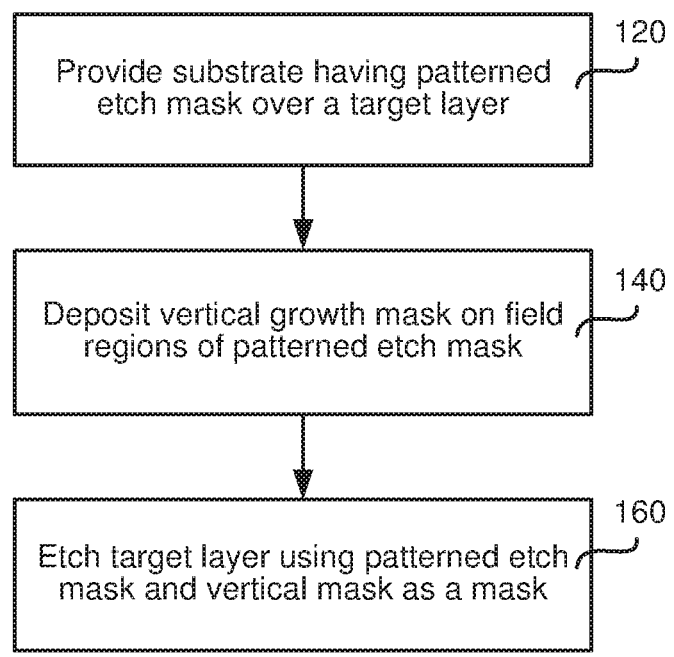
FIG. 1 is a process flow diagram depicting operations performed in accordance with certain disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In semiconductor device manufacturing, masking methods are used to pattern and etch substrates. As substrate aspect ratios increase, the demand for highly selective hard masks increases. Various patterning schemes involve formation of positive features, such as dielectric spacers, to be used as a mask for etching a target layer. However, some dielectric spacers may be susceptible to erosion, particularly where the aspect ratio of gaps between the dielectric spacers is very large and the depth of the gaps may therefore be large, which may result in longer etching durations to etch the target layer under the dielectric spacers. Thus, some dielectric spacers may erode during etching of the target layer.

Some methods exist to prevent erosion of etch masks during etching, but such methods involve plasma-enhanced chemical vapor deposition (PECVD) processes that results in breadloafing growth on etch masks, thereby reducing the critical dimension of negative features between masks and changing the feature profile. This is a particular concern with very high aspect ratio features and etching operations of long duration.

For formation of these masks, techniques involve alternating between etching an underlayer, such as a target layer, and depositing additional mask material to address the eroding mask during the etching, the operations of which involve different process gases and occasionally different tools, which lengthens processing time as the wafer is transferred from station to station, or even tool to tool.

Provided herein are methods of depositing masks on field regions of a patterned substrate while substantially preserving the critical dimension of the mask. In various embodiments, deposition of the mask can be performed while selectively etching a target layer in a negative feature of the mask.

Vertical growth masks described herein are deposited such that there is little to no deposition horizontally as the mask is being deposited; that is, deposition on a field region of a positive substrate results in sidewalls of the vertical growth mask being mostly vertical without changing the size of spaces between positive features of the patterned mask. Deposition is performed with substantially no deposition on the sidewalls of the positive substrate, and most or all deposition occurs only on the field region. As the mask grows vertically, additional deposited mask material is deposited largely on the existing mask material and growth is substantially vertical; that is, little to no mask material is deposited on sidewalls of the deposited mask, and vertically grown masks can grow to a variety of thicknesses, as appropriate for particular applications. The deposition is selective in that it preferentially forms new material on positive features, and particularly the tops of these features. The selective deposition may proceed in a manner that forms the new material vertically on top of the positive features without substantially extending horizontally. Thus, one particular advantage of certain disclosed embodiments is the ability to preserve feature critical dimension—that is, the width of the space between positive features that the vertically grown masks are deposited on—such that the deposited vertically grown mask has a width that is substantially the same as the underlying etch mask it is deposited on. For purposes of clarity, the material that the vertically grown masks are deposited on are referred to as the "underlying etch mask" or "etch mask" but it is understood that a variety of materials, including polymeric, dielectric, and semiconductor materials could be used for the etch mask. It will be understood that the etch mask may be a patterned photoresist. It will also be understood that the etch mask may be a patterned anti-reflective coating, such as a bottom anti-reflective coating (BARC) layer or dielectric anti-reflective coating (DARC) layer. The term "vertically grown mask" is used to refer to the material deposited over the underlying etch mask that results in preservation of feature critical dimension and mask width. An advantage of certain disclosed embodiments is the ability to avoid trimming or thinning of the formed mask structure. Thinning or trimming is defined by a reduction in critical dimension exceeding 2% of the critical dimension, or any recession or roughness of the sidewalls.

Vertically grown masks may be tungsten-containing materials, such as tungsten metal. In many embodiments, the tungsten-containing material is not pure metallic tungsten and may contain some impurities. While tungsten is described herein as one example of a material, it will be understood that other metal-containing materials or even metal-free materials may be used by employing appropriate reactants and process conditions to achieve vertical growth.

Also disclosed herein are methods of simultaneously depositing a vertically grown mask while etching an underlayer during the same operation. The process conditions used for depositing a vertically grown mask can also be used to etch an underlying target material such as an anti-reflective layer or an amorphous carbon layer such that each exposure of the substrate to the process conditions, including but not limited to precursor gases, plasma conditions, temperature, and pressure, causes both formation of vertically grown mask on the underlying etch mask as well as etching of an underlying target material under the underlying etch mask. In other words, a single process simultaneously forms a vertical mask on field regions and etches target material in features.

Disclosed embodiments involve choosing a process window and the geometry of the underlying mask pattern to achieve vertical growth of the vertically grown mask, etching of an underlying target material, or both.

Without being bound by a particular theory, it is believed that geometry selectivity, material selectivity, or both, contribute to the ability of certain disclosed embodiments to achieve selective vertical growth, and in some cases concurrent etching of an underlying target material. Geometry selectivity refers to selectivity achieved by depositing more material in one area of a substrate having a first geometric characteristic relative to another area of the substrate having a second geometric characteristic, the areas being defined as locations on a substrate based on the geometry or topography of the substrate exposed. This form of selectivity is based on geometry alone, without requiring different materials to selectively enhance or inhibit deposition. Thicker deposition in one area versus another is dictated by the deposition rate (thickness deposited over time unit) in each area. Geometry selectivity may be achieved due to the aspect ratio of a negative feature on a substrate and may result in a deposition rate on field regions of the substrate (that is, on either side of the feature opening of the negative feature) that is greater than the deposition rate on the sidewalls or bottom areas of the negative feature. It is believed that vertical growth is achievable in certain disclosed embodiments due to the high aspect ratio of negative features between the positive features defined by the underlying etch mask.

Material selectivity refers to selectivity achieved by depositing more material on one material of a substrate relative to another material on the substrate due to the chemical, physical, morphological, etc. (composition, lattice structure, or any other property) differences of the materials; that is, for example, deposition rate on a dielectric material may be greater than deposition rate on a conductive material. It is believed that vertical growth may be achievable in certain disclosed embodiments due to material selectivity between the surface of the underlying etch mask (or the surface of the deposited material of the vertically grown mask) and the surface of the target material underlying the underlying etch mask. Additionally, as the vertically grown mask is deposited, it is believed that vertical growth is achievable in certain disclosed embodiments due to material selectivity between the surface of the deposited material of the vertically grown mask and the surface of both the underlying etch mask and the target material underlying the underlying etch mask. This form of selectivity is based on material differences alone, without requiring different surface geometries to selectively enhance or inhibit deposition. Of course, in some cases, selectivity can be imparted by a combination of geometric and compositional differences on the exposed surface.

FIG. 1 is a process flow diagram depicting operations performed in accordance with certain disclosed embodiments.

In operation 120, a patterned semiconductor substrate having a patterned etch mask over a target layer is provided.

The semiconductor substrate may be a silicon wafer, e.g., a 200-mm wafer, a 300-mm wafer, or a 450-mm wafer, including wafers having one or more layers of material, such as dielectric, conducting, or semi-conducting material deposited thereon. Non-limiting examples of under-layers include dielectric layers and conducting layers, e.g., silicon oxides, silicon nitrides, silicon carbides, metal oxides, metal nitrides, metal carbides, and metal layers (e.g., copper, aluminum, tungsten, cobalt, ruthenium, molybdenum, tantalum, etc.).

The patterned etch mask is sometimes referred to herein as an "underlying etch mask." The patterned etch mask may include spaced apart positive features (the opposite of recesses) During etch, the spaced apart features are transferred to the substrate either directly on a target layer or on an intermediate layer over a target layer. The size of the positive features may be characterized as the critical dimension, which is the measured width horizontally across the positive feature at the shortest distance from one sidewall to another sidewall in a cross section of the positive feature. Each positive feature includes sidewalls and an exposed field region. The exposed field region is a top horizontal region of a feature. The field region may be defined by a mask previously used to pattern the patterned etch mask, such as a patterned photoresist; during etch, the mask used to pattern the patterned etch mask has been removed, leaving an exposed field region of the patterned etch mask features. In various embodiments, the average critical dimension of positive features on the substrate is between about 10 nm and about 200 nm.

The separation distance of adjacent features is the features' pitch, which is measured from the center of a first space between positive features of the mask to an adjacent space on the other side of a positive feature. The distance between the positive features may be referred to herein as a "negative feature" which has a "negative feature opening" measured horizontally across a space between two positive features, as measured from the sidewall of a positive feature to the sidewall of an adjacent positive feature. In certain embodiments, the negative features have an average aspect ratio of at least about 1:1, or between about 50:1 and about 100:1. It will be understood that in some embodiments, a variety of feature sizes and/or aspect ratios may be present across a surface of the substrate. It will also be understood that in some embodiments, the same and/or similar feature sizes may be present across a surface of a substrate.

In certain embodiments, the patterned etch mask has an average thickness between about 5 nm and about 3000 nm. The average thickness of the patterned etch mask is measured from taking an average of thicknesses measured vertically from the field region of the positive feature for each feature to the top of the immediate adjacent layer under the mask.

In certain embodiments, the patterned etch mask is a dielectric material, silicon, carbon, or a polymeric material.

In some embodiments, dielectric material includes silicon oxide, silicon nitride, silicon oxynitride (SiON), or a combination thereof. A dielectric material may be deposited using a silicon-containing precursor and one or more oxygen-containing and/or nitrogen-containing reactants, by thermal techniques or by plasma assisted techniques. As an example, dielectric material may be etched using a fluorocarbon-containing chemistry, with optional plasma.

"Silicon oxide" is referred to herein as including any and all stoichiometric possibilities for $Si_xO_y$, including integer values of x and y and non-integer values of x and y. For example, "silicon oxide" includes compounds having the formula $SiO_n$, where $1 \leq n \leq 2$, where n can be an integer or non-integer values. "Silicon oxide" can include sub-stoichiometric compounds such as $SiO_{1.8}$. "Silicon oxide" also includes silicon dioxide ($SiO_2$) and silicon monoxide (SiO). "Silicon oxide" also includes both natural and synthetic variations and also includes any and all crystalline and molecular structures, including tetrahedral coordination of oxygen atoms surrounding a central silicon atom. "Silicon oxide" also includes amorphous silicon oxide and silicates.

"Silicon nitride" is referred to herein as including any and all stoichiometric possibilities for $Si_xN_y$, including integer values of x and y and non-integer values of x and y, such as x=3 and y=4. For example, "silicon nitride" includes compounds having the formula $SiN_n$, where $1 \leq n \leq 2$, where n can be an integer or non-integer values. "Silicon nitride" can include sub-stoichiometric compounds such as $SiN_{1.8}$. "Silicon nitride" also includes $Si_3N_4$ and silicon nitride with trace and/or interstitial hydrogen (SiNH) and silicon nitride with trace amounts of and/or interstitial oxygen (SiON). "Silicon nitride" also includes both natural and synthetic variations and also includes any and all lattice, crystalline, and molecular structures, including trigonal alpha-silicon nitride, hexagonal beta-silicon nitride, and cubic gamma-silicon nitride. "Silicon nitride" also includes amorphous silicon nitride and can include silicon nitride having trace amounts of impurities.

In some embodiments, polymeric material has a chemical formula $C_xH_yO_z$ and may be previously deposited by spin-on methods and patterned using an etch chemistry including oxygen and a fluorocarbon gas and/or plasma. In some embodiments, polymeric material is a photoresist patterned by exposing to radiation and developing using a lithography technique such as EUV lithography.

In some embodiments, the patterned etch mask is a patterned photoresist.

In some embodiments, the patterned etch mask may have been previously patterned using a developed photoresist as a mask. The patterned etch mask may be or include an anti-reflective layer in some embodiments. For example, the patterned etch mask may be a BARC layer, or may be a DARC layer.

In operation 140, a vertical growth mask is deposited on exposed field regions of the patterned etch mask. The vertical growth mask is deposited using precursors and process conditions such that the mask deposited over time increases in thickness without substantially depositing on sidewalls of the patterned etch mask, or sidewalls of the vertical growth mask as the mask is deposited. This behavior may be referred to as "vertical growth" but it will be understood that "vertical" is used only as a term to describe the phenomenon when the substrate is oriented with its active surface oriented horizontally. In some embodiments, the precursor and process conditions may be selected to tune the profile of the material deposited in the vertical growth mask. In some embodiments, the vertical growth mask is a patterned tungsten-containing mask.

The vertical growth mask may be a metal-containing material, or a non-metal material. Example materials for the vertical growth mask include a silicon-containing material such as silicon, a carbon-containing material, a boron-containing material, a titanium-containing material, a ruthenium-containing material, and a tungsten-containing material, such as tungsten metal, or doped tungsten metal.

The vertical growth mask may be deposited by introducing one or more process gases and igniting a plasma. The one or more process gases used depends on the material to be deposited for the vertical growth mask. In various embodiments, the one or more process gases include a metal-containing gas. In some embodiments, the metal-containing gas is a metal halide. In some embodiments, the metal-containing gas is a metal carbonyl gas. The metal-containing gas may include a tungsten-containing gas. Example tungsten-containing gases include tungsten halides, such as tungsten pentachloride, tungsten hexachloride, tungsten pentafluoride, and tungsten pentachloride. In some embodiments, the metal-containing gas includes a titanium-containing gas, such as titanium chloride ($TiCl_4$). In some embodiments, the metal-containing gas includes a ruthenium-containing gas, such as triruthenium dodecacarbonyl ($Ru_3(CO)_{12}$). In various embodiments, the one or more process gases include a carbon-containing gas or a boron-containing gas. Example carbon-containing gases include methane ($CH_4$), acetylene ($C_2H_2$), and propylene ($C_3H_6$). Example boron-containing gases include diborane ($B_2H_6$). In various embodiments, a tungsten-containing gas is used to deposit a tungsten-containing vertical growth mask. In various embodiments, a carbon-containing gas is used to deposit a carbon-containing vertical growth mask. In various embodiments, a boron-containing gas is used to deposit a boron-containing vertical growth mask. In various embodiments, a titanium-containing gas is used to deposit a titanium-containing vertical growth mask. In various embodiments, a ruthenium-containing gas is used to deposit a ruthenium-containing vertical growth mask.

In some embodiments, the plasma is ignited in an environment with the one or more process gases. For example, in some embodiments, the plasma may be ignited in a tungsten-containing gas environment. While plasma-based deposition processes are described herein, in some embodiments, a plasma-free thermal process may be used by selecting the process conditions such as chamber pressure, gas flow, temperature, etc.

In some embodiments, the one or more process gases include a non-metal gas, such as a. silicon-containing gas or a carbon-containing gas, depending on the material of the vertical growth mask.

The one or more process gases for depositing the vertical growth mask may be delivered with one or more carrier gases and/or dilution gases. In some embodiments, carrier gases may be diverted before delivery into a process chamber housing the substrate. In some embodiments, carrier gases are delivered into the process chamber with the one or more process gases. Example carrier gases include argon, hydrogen, helium, and combinations thereof.

Dilution gases, which may be the same composition as a carrier gas, can be used together with the process gases for depositing the vertical growth mask or can be introduced as a separate operation. Dilution gases can be used to limit etching or trimming by halogen species that can decompose from using metal halides to deposit the vertical growth mask. Dilution gases may be ignited with a plasma to facilitate scavenging of halogen species.

The composition of the gases delivered for depositing the vertical growth mask may affect the deposition profile of the deposited vertical growth mask. In particular, the ratio of process gases can be used to modulate the directionality and the growth rate of the vertical growth mask. For example, in some embodiments, the ratio of tungsten hexafluoride to hydrogen is between about 1:0 and about 1:5 to achieve a vertically deposited vertical growth mask having a critical dimension within about 150% of the critical dimension of the patterned etch mask.

in particular, in some embodiments, the vertical growth mask may be deposited by introducing a tungsten hexafluoride with a mixture of argon and hydrogen and igniting a plasma.

The plasma is ignited using process conditions, including but not limited to plasma power and frequency, selected such that exposure of the field regions of the patterned mask to the plasma in the process gas environment over time results in an increase in thickness of the vertical growth mask while the critical dimension of the vertical growth mask is substantially the same as, such as within about 10% or within about 5% of the critical dimension of the patterned etch mask.

In some embodiments, a plasma is ignited and a process gas reacts with the field region of the patterned etch mask for the deposition process. In some embodiments, a process gas reacts with the substrate or is adsorbed onto the surface of field region of the patterned etch mask. In various embodiments, deposition is preferential or selective such that deposition occurs faster on field regions of the patterned etch mask than on sidewalls of the patterned etch mask. In some embodiments, there is substantially no deposition on the sidewalls of the patterned etch mask. In various embodiments, a process gas is introduced into the chamber in a gaseous form and may be optionally accompanied by a carrier gas, such as argon, helium, hydrogen, or combinations thereof. The species generated from a process gas plasma can be generated directly by forming a plasma in the process chamber housing the substrate or they can be generated remotely in a process chamber that does not house the substrate, and can be supplied into the process chamber housing the substrate.

In some embodiments, the plasma is formed in situ, such that the plasma is formed directly above the substrate surface in the chamber. In various embodiments, the plasma is an inductively coupled plasma or a capacitively coupled plasma. In some embodiments, a bias of between about 0V and about 500V is applied to a pedestal holding the substrate to cause charged plasma species to travel directionally toward the substrate.

In various embodiments, the plasma power for a single wafer is between about 100 W and about 500 W. Plasma may be generated using high frequency and/or low frequency plasma.

During operation 140, the substrate temperature may be set to a temperature between about 20° C. and about 80° C. It will be understood that the substrate temperature is the temperature for which a pedestal holding the semiconductor substrate is set to in order to heat or cool the substrate itself, and may not necessarily be the exact temperature of the substrate itself at any given time.

Operation 140 may be performed in a process chamber set to a chamber pressure between about 10 mTorr and about 100 mTorr. It will be understood that the pressure may be modulated as desired to achieve deposition rate and particular deposition profiles. In some embodiments, pressure is modulated to achieve largely vertical growth such that the critical dimension of the vertical growth mask is within about 150% of the critical dimension of the patterned etch mask.

In various embodiments, the deposition rate, deposition profile, and directionality of deposition (that is, achieving certain shapes for the deposited vertical growth mask) are achieved by modulating a process condition such as plasma power, chamber pressure, substrate temperature and/or gas flow composition and/or flow rates and/or ratio of flow rates of gases flowed to deposit the vertical growth mask. The selectivity of the deposition also depends on the material the vertical growth mask is deposited on and the other exposed regions of the substrate.

For example, deposition of a tungsten vertical growth mask can be achieved on a DARC material relative to exposed carbon-containing material. In particular, deposition of a tungsten vertical growth mask can be achieved on a silicon oxynitride material relative to an exposed amorphous carbon material. In some embodiments, deposition of a vertical growth mask can be achieved on a polymeric BARC material relative to a DARC material, Selective deposition can also be achieved using particular feature geometries. For example, aspect ratios of spaces between positive features of a patterned etch mask prior to deposition can range from about 50:1 to about 200:1. Selective deposition of the vertical growth mask can be achieved where the width of negative features between positive features of the patterned etch mask prior to deposition is between about 10 nm and about 200 nm. Selective deposition of the vertical growth mask can be achieved where depth of negative features between positive features of the patterned etch mask is at least about 20 nm.

Operation 140 may be performed by simultaneously introducing one or more process gases and one or more carrier gases and igniting a plasma in a plasma-enhanced chemical vapor deposition-type process.

Operation 140 may be performed by introducing one or more process gases and one or more carrier gases in alternate pulses and igniting a plasma during at least one of the process gas introduction or carrier gas introduction or both in a plasma-enhanced atomic layer deposition (PEALD) type process.

Alternate pulsing deposition is performed by repeating a cycle. A cycle may include one pulse of a first gas and one pulse of a second, different gas, where the second gas is not flowed during the pulse of the first gas and the first gas is not flowed during the pulse of the second gas.

In one example, a deposition cycle performed during operation 140 is a pulse of tungsten hexafluoride and a pulse of an argon/hydrogen mixture.

Each pulse in a deposition cycle can be a particular duration. The pulses of the first gas and the pulse of the second gas may have different durations. The pulse of the first gas and the pulse of the second gas may have the same duration. In one example, a pulse of tungsten hexafluoride may be between about 100 milliseconds and about 10 seconds while a pulse of an argon/hydrogen mixture may be between about 100 milliseconds and about 10 seconds.

In some embodiments, the second gas is used to scavenge or treat the substrate. For example, in some embodiments, prolonged exposure of particular patterned etch masks to tungsten hexafluoride may result in degradation of the patterned etch mask, and/or prolonged exposure of an underlying target layer may result in degradation of the target layer. Alternating between introducing a tungsten hexafluoride and introducing a carrier gas or mixture of carrier gases that can scavenge surfaces of the substrate can prevent unwanted etching or trimming of the patterned etch mask and target layer. During the pulse of the carrier gas, a plasma may be ignited.

In various embodiments of cyclic deposition, various cycles of alternating pulses of the process gas and carrier gas are performed, such as at least about 2 cycles, or between about 3 cycles and about 20 cycles. Additionally, since the duration of each pulse may vary, the number of cycles may depend on the duration of each pulse as well as the desired thickness of the vertical growth mask.

In some embodiments, process conditions may vary from cycle to cycle depending on the deposition profile desired.

Returning to FIG. 1, in operation 160, a target layer underlying the patterned etch mask is etched using the patterned etch mask and deposited vertical growth mask as a mask. The patterned etch mask and deposited vertical growth mask have similar critical dimensions while the pitch remains the same and essentially spaces between the features of the mask are flanked by sidewalk that include both patterned etch mask material and vertical growth mask material. Etching is performed using these features as a mask using chemistry selective to etching the target layer such that etch rate of the target layer is substantially greater than etch rate of the vertical growth mask. Etch rate depends on the composition of etch gases used and the process conditions. Etch gases depend on the material of the target layer and the depth to which the target layer may be etched.

In one example, the target layer is an amorphous carbon layer and the etch gas used includes a fluorocarbon having a chemical formula of $C_xF_yH_z$ where x is 1-4, y is 1-8, and z is 1-6. A plasma may be ignited during etching. The plasma may be ignited using a plasma power between about 50 W and about 3000 W for a single wafer. The etch rate of amorphous carbon using a $CF_4$ plasma ignited using a plasma power of 300W may be at least about 1.5 times greater than etch rate of a tungsten vertical growth mask.

While etching may be selective such that the target layer etches faster than the mask, it will be understood that in some embodiments, the vertical growth mask may be degraded over prolonged exposure to etching chemistry for the target layer. In various embodiments. etching of the target layer may be ceased temporarily in order to deposit additional vertical growth mask by repeating operation 140 followed by continuing to etch in operation 160.

In some embodiments, operations 140 and 160 are performed simultaneously. That is, in some embodiments, deposition of a vertical growth mask can occur while etching the target layer by introducing a selection of process gases and modulating the process conditions including temperature and plasma power to reduce depletion of the vertical growth mask while etching the target layer. Particular examples are further described below.

Simultaneously etching the target layer and depositing the vertical growth mask has multiple advantages. First, gases used for depositing the vertical growth mask can be delivered to the same chamber used for etching the target layer while flowing the etching gases used for etching the target layer, thereby increasing efficiency and avoiding moving a wafer between chambers, between stations, or even between tools for forming the mask and etching the target layer. Second, since the vertical growth mask deposition gas chemistries are continuously introduced, there is little to no risk of having a degraded mask when etching the target layer. This can allow etching of very thick materials that involves long exposure times to etching chemistry without the mask degrading during etching of the very thick materials. For example, a target layer to be etched can have a thickness between about 500 nm and about 5000 nm. Third, process conditions are carefully tailored to allow deposition of the vertical growth mask to have substantially the same critical dimension as the critical dimension of the patterned etch mask, so even if the target layer is exposed to the deposition gases of the vertical growth mask, the vertical growth mask is deposited only on the field regions of the patterned etch mask, or on field regions of a deposited vertical growth mask, with little to no deposition on sidewalls of spaces between the patterned etch mask or the vertical growth mask.

Simultaneously etching and depositing the vertical growth mask involves modulating process conditions and gas flows to achieve a tolerable etch rate of the target layer while maintaining a thickness of a vertical growth mask to prevent degradation during etching of the target layer. In some embodiments, performing operation 140 and 160 simultaneously involves introducing one or more gases suitable for etching the target layer and one or more gases suitable for depositing the vertical growth mask together. The one or more gases suitable for etching the target layer are described above with respect to operation 160. The one or more gases suitable for depositing the vertical growth mask are described above with respect to operation 140. In some embodiments, the one or more gases suitable for etching the target layer include a fluorocarbon gas. In some embodiments, the one or more gases suitable for depositing a vertical growth mask includes a tungsten-containing gas. In various embodiments, the ratio of fluorocarbon gas flow rate to tungsten-containing gas flow rate affects the etch rate of the target layer and the deposition rate of the vertical growth mask. In various embodiments, where the target layer is amorphous carbon and the vertical growth mask is a tungsten mask deposited on an SiON patterned etch mask, the ratio of carbon tetrafluoride gas flow rate to tungsten hexafluoride gas flow rate is between about 20:1 and about 1:1. In some embodiments, the fluorocarbon gas is delivered at a flow rate less than about 80% of the total flow rates of all gases delivered. In various embodiments, simultaneous etching and depositing can result in a net etch rate of 1 nm/sec of the target layer for a net deposition rate of 0.5 nm/sec of the vertical growth mask.

In one example, the target layer is amorphous carbon and the vertical growth mask is a tungsten mask deposited on an SiON patterned etch mask having a critical dimension of 50 nm, and the vertical growth mask is deposited by performing three cycles at a substrate temperature of 60° C. and a chamber pressure of 20 mTorr, each cycle including one pulse of tungsten hexafluoride at a flow rate of 30 sccm for a duration of 10 seconds and one pulse of an argon/hydrogen plasma where the argon flow rate is 200 sccm and the hydrogen flow rate is 200 sccm ignited at a plasma power of 300 W at a substrate temperature of 60° C. and a chamber pressure of 20 mTorr. The deposited vertical growth mask has a critical dimension of 50 nm with a thickness of 50 nm, with no deposition on sidewalls of the SiON patterned etch mask.

In another example, the target layer is amorphous carbon and the vertical growth mask is a tungsten mask deposited on an SiON patterned etch mask having a critical dimension of 50 nm. The amorphous carbon layer is etched while the vertical growth mask is deposited by introducing tungsten hexafluoride at a flow rate of about 10 sccm, fluorocarbon gas (e.g. $CH_2F_2$ and $SF_6$) at a flow rate of 50 sccm, and igniting helium plasma, where the helium flow rate is 300 sccm, at a plasma power of 300 W at a substrate temperature of 40° C. and a chamber pressure of 10 mTorr. The deposited vertical growth mask has a critical dimension of 50 nm with a thickness of 50 nm, with no deposition on sidewalk of the SiON patterned etch mask and the amount of amorphous carbon layer etched is less than about 20 A.

In some embodiments, operations 140 and 160 are performed as alternating, sequential operations, by repeating a cycle that includes operation 140 then operation 160 and repeating the cycle multiple times. In some embodiments, operation 140 is performed after operation 160 is performed for a certain duration such that operation 140 functions to replenish vertical growth mask that degrades during operation 160.

Particular examples are further described below.

Figure 2:
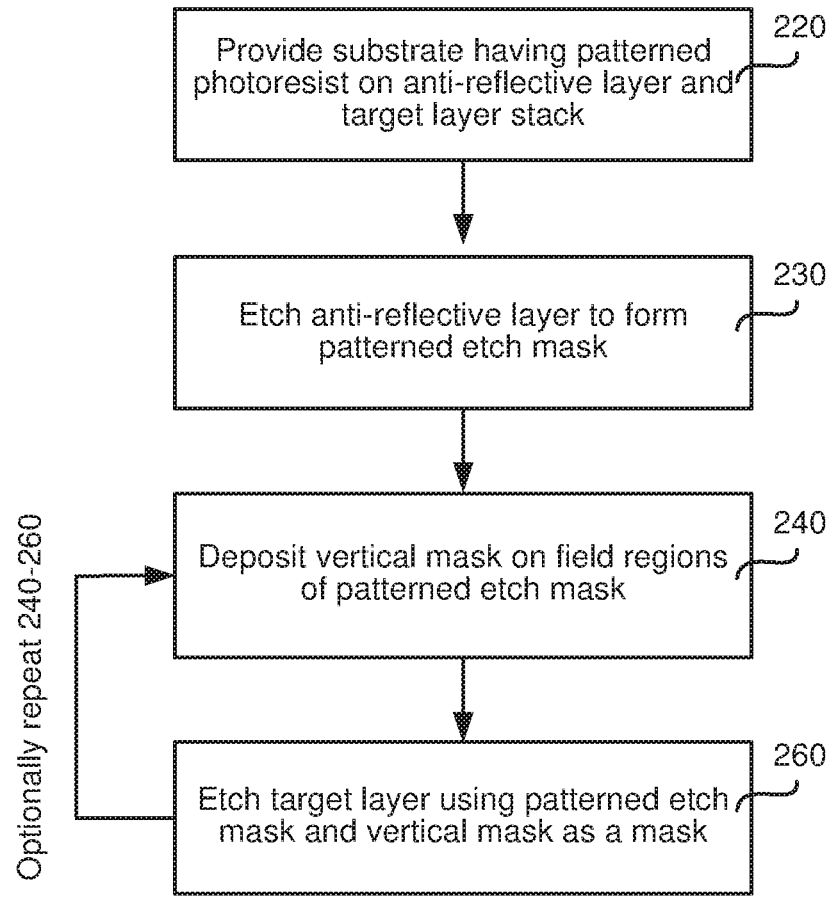
FIG. 2 is process flow diagram depicting operations performed in accordance with certain disclosed embodiments.

FIG. 2 is a process flow diagram depicting operations performed in accordance with certain disclosed embodiments. FIG. 2 provides an example process flow for transferring a pattern of a patterned photoresist to an anti-reflective layer and selectively depositing a vertical mask on the patterned anti-reflective mask to form a multi-layer mask that includes both the anti-reflective layer and the vertical mask and etching a target layer using the multi-layer mask.

In operation 220, a patterned semiconductor substrate having a patterned photoresist on an anti-reflective layer over a target layer is provided. It will be understood that in some embodiments, more than one anti-reflective layer, as well as other layers such as cap layers, barrier layers, and the like, may be on the substrate.

Figure 3:
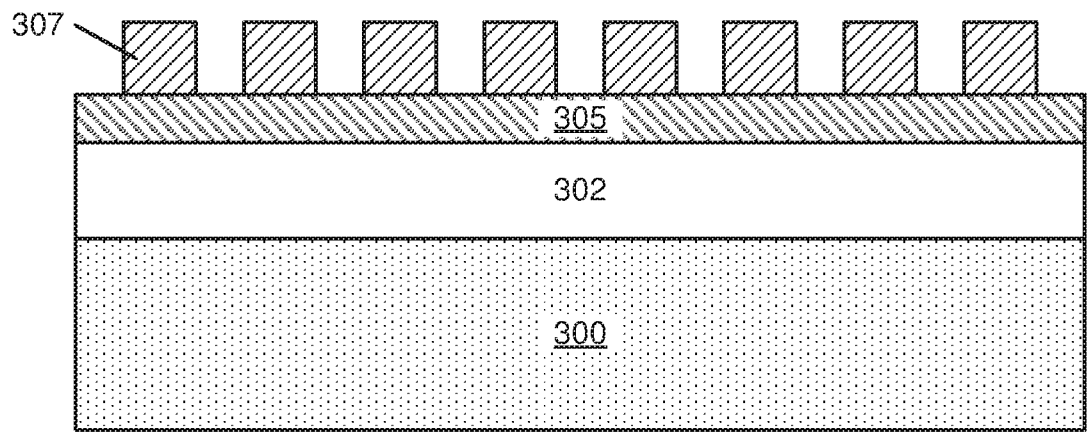
FIGS. 3, 4, 5, 6A-6B, 7A-7B, and 8A-8C are schematic illustration of substrates undergoing operations of certain disclosed embodiments.

FIG. 3 is a schematic illustration of an example semiconductor substrate that may be provided in operation 220. While particular materials are described herein and a particular stack is depicted in FIG. 3, it will be understood that other semiconductor substrate may be provided in operation in 220 of FIG. 2.

FIG. 3 includes a target layer 300, which may be any suitable material. In some embodiments, target layer 300 may be an amorphous carbon layer. Overlying the target layer 300 is a DARC layer 302, which may be, in some embodiments, a silicon-containing material, such as any one or more of silicon oxide, silicon nitride, and silicon oxynitride. Over the DARC layer 302 is a BARC layer 305, which may be a polymeric material deposited by spin-on methods. The top surface of the BARC layer 305 includes a patterned photoresist 307, which may be lithographically patterned and contain silicon, carbon, or both.

Returning to FIG. 2, in operation 230, an anti-reflective layer is etched to form a patterned etch mask. Operation 230 may involve providing one or more etch gases suitable for etching an anti-reflective layer, depending on the material of the layer, and optionally igniting a plasma and applying a bias. Etching is selective to an underlayer of the anti-reflective layer to prevent etching of an underlayer.

Figure 4:
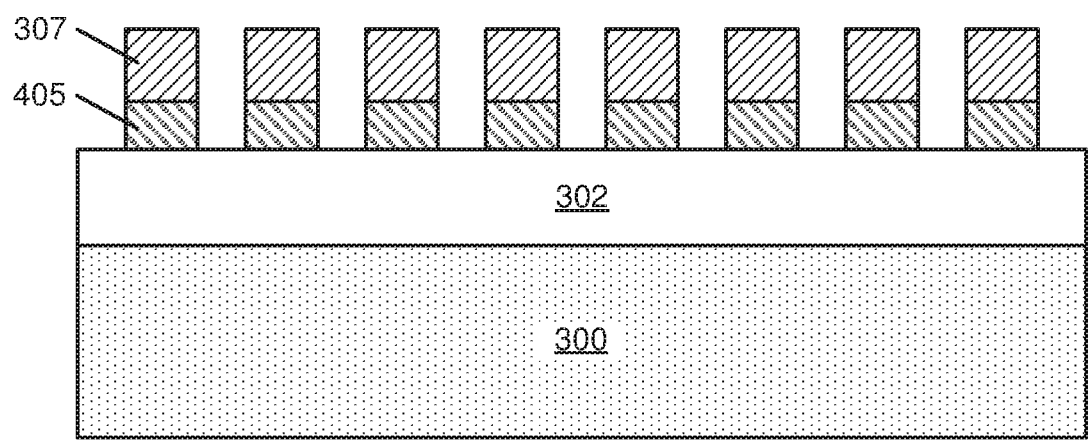
Figure 5:
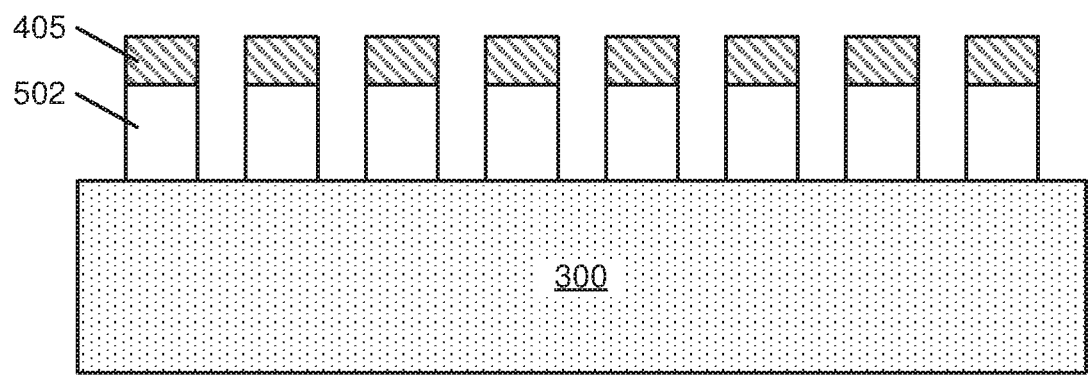

FIGS. 4 and 5 are schematic illustrations of example semiconductor substrates after etching an anti-reflective layer in operation 230. FIG. 4 shows a substrate having target layer 300 and DARC layer 302 where BARC layer 305 from FIG. 3 is etched to form a patterned BARC layer 405. This forms a patterned etch mask that includes patterned BARC layer 405, which can then be used to etch an underlayer such as the DARC layer 302.

In some embodiments, operation 230 also includes etching the DARC layer 302. FIG. 5 shows a substrate having target layer 300 where, after BARC layer 305 is etched to form a patterned BARC layer 405, DARC layer 302 is etched to form patterned DARC layer 502. The patterned photoresist 307 is removed and/or degraded from the etching of the different anti-reflective layers. This forms a patterned etch mask that includes both patterned BARC layer 405 and patterned. DARC layer 502.

Returning to FIG. 2, in operation 240, a vertical growth mask is deposited on exposed field regions of the patterned etch mask formed in operation 230. Operation 240 may be performed using any of the suitable process gases, process conditions, and other features described above with respect to operation 140 as described above with respect to FIG. 1. For example, the vertical growth mask may be deposited using one or more cycles of alternating pulses of a tungsten-containing precursor and an argon and hydrogen gas mixture while igniting plasma.

Figure 6A:
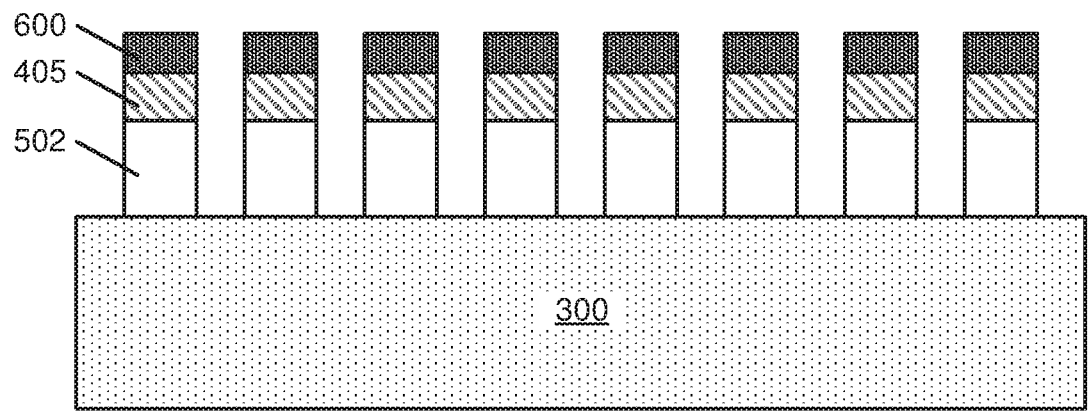
Figure 6B:
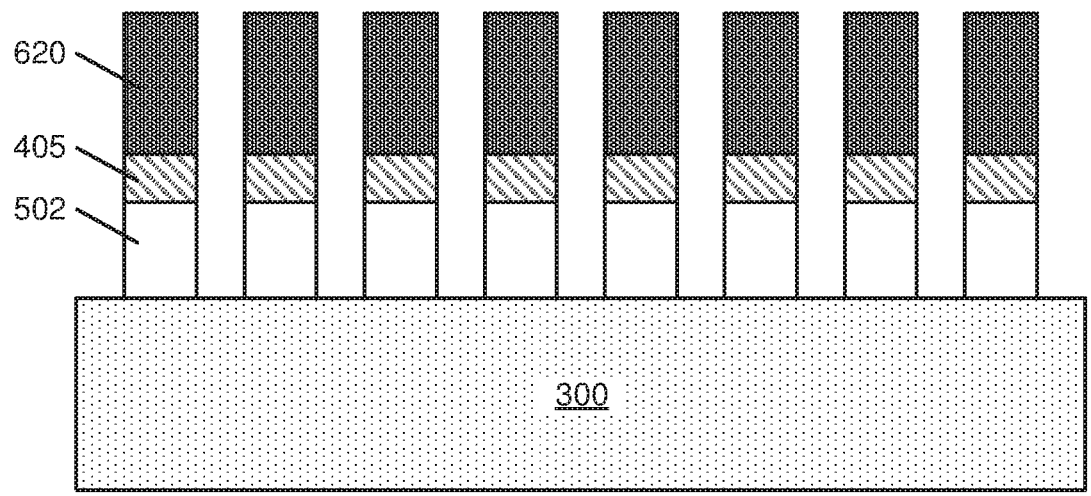

FIGS. 6A and 6B show an example whereby deposition of a vertical mask is formed selectively without depositing on a target layer 300, and without etching the target layer 300. FIG. 6A shows a substrate following FIG. 5, such that the substrate includes target layer 300, patterned. BARC layer 405, and patterned DARC layer 502. Vertical growth mask 600, which may be tungsten, is deposited on the field regions of the patterned BARC layer 405 with little to no deposition on the sidewalls of the patterned BARC layer 405 or patterned DARC layer 502 or on the exposed surface of the target layer 300, FIG. 6B shows a substrate after operation 240 of FIG. 2 is performed for a duration sufficient to form a thicker vertical growth mask 620. As shown in FIG. 6B, the substrate can be exposed to process gases and process conditions to achieve selective, vertical deposition of the vertical mask 620 without depositing on the sidewalls of the patterned. BARC layer 405 or patterned DARC layer 502 or on the exposed surface of the target layer 300. The critical dimension of thicker vertical growth mask 620 is about the same as the critical dimension of the patterned DARC layer 502 and the patterned BARC layer 405.

Returning to FIG. 2, in operation 260, the target layer 300 is etched using the patterned etch mask and vertical mask as a mask. Operation 260 may be performed using any of the suitable process gases, process conditions, and other features described above with respect to operation 160 as described above with respect to FIG. 1.

As with the deposition and etch operations in FIG. 1, operations 240 and 260 may be performed simultaneously, or may be performed in separate operations, and may be repeated in multiple cycles. Variations of simultaneous, sequential, and repeated operations described above with respect to operations 140 and 160 may be applied to operations 240 and 260.

Figure 7A:
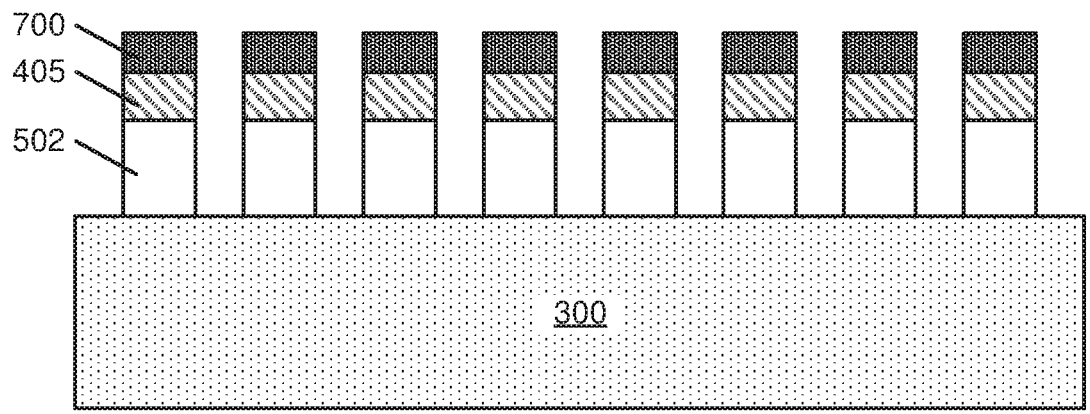
Figure 7B:
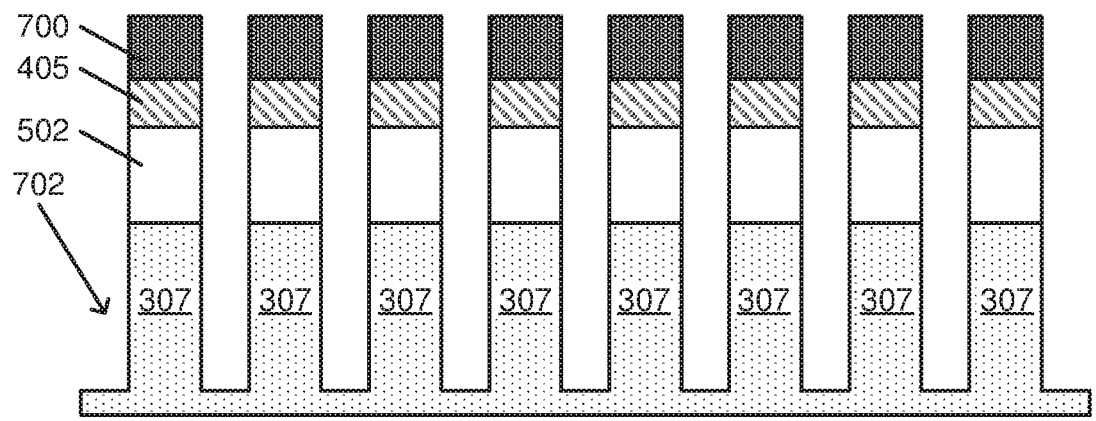

FIGS. 7A and 7B show an example whereby deposition of a vertical mask is formed selectively without depositing on a target layer, and without etching the target layer, while etching the target layer.

FIG. 7A shows a substrate following FIG. 5, such that the substrate includes target layer 300, patterned BARC layer 405, and patterned DARC layer 502. Vertical growth mask 700, which may be tungsten, is deposited on the field regions of the patterned BARC layer 405 with little to no deposition on the sidewalks of the patterned BARC layer 405 or patterned DARC layer 502 or on the exposed surface of the target layer 300.

FIG. 7B shows a substrate where operations 240 and 260 of FIG. 2 are performed simultaneously for a duration sufficient to etch much of the target layer 300 to form negative features 702 in the target layer 300 to form etched target layer 307 while maintaining and/or adding to the thickness of the vertical growth mask 700. Continuous exposure to both gases for depositing the vertical growth mask 700 and gases for etching the target layer 300 can be used to achieve this result. Although the thickness of vertical growth mask 700 in FIG. 7I3 is depicted as being largely the same as the thickness of vertical growth mask 700 in FIG. 7A, it will be understood that in some embodiments, the thickness may be different (thinner or thicker) after continuous exposure to both the etching gases for etching the target layer 300 and the gases for depositing the vertical growth mask 700.

Figure 8A:
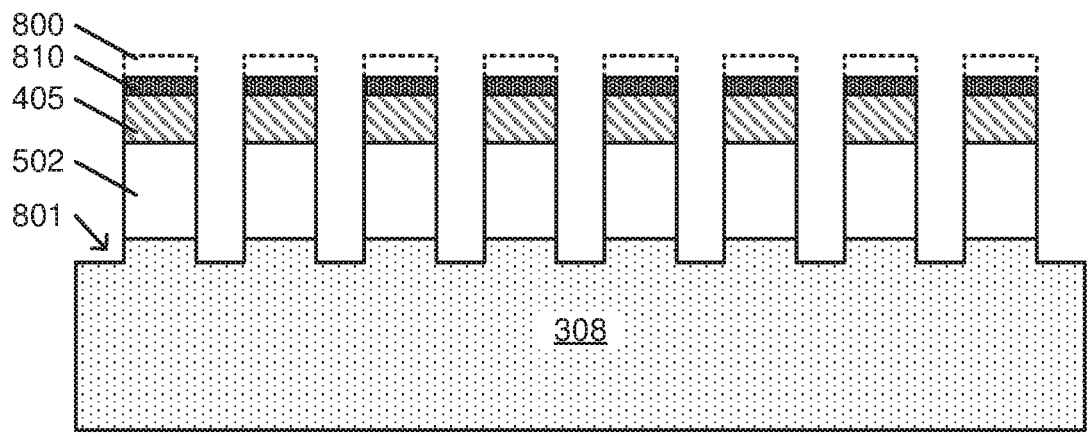

FIGS. 8A and 8I3 show an example whereby deposition of a vertical mask and etching of the target layer are performed in alternating pulses in a cyclic process. The vertical mask is formed selectively without depositing on a target layer, and without etching the target layer.

FIG. 8A shows a substrate following FIG. 5 after operation 260 is performed such that the profile of the vertical growth mask 800 prior to etching is exposed to etchants for etching the target layer 300 using patterned BARC layer 405, and patterned DARC layer 502 as a mask to form partially etched target layer 308. The amount of target layer 300 etched in this operation is shown at arrow 801, while the vertical growth mask 800 may have some material etched resulting in an etched vertical growth mask 810. This may occur where the vertical growth mask 800 has an etch rate substantially slower than the etch rate of the target layer 300 but the exposure duration is long enough to etch some of the vertical growth mask 800.

Figure 8B:
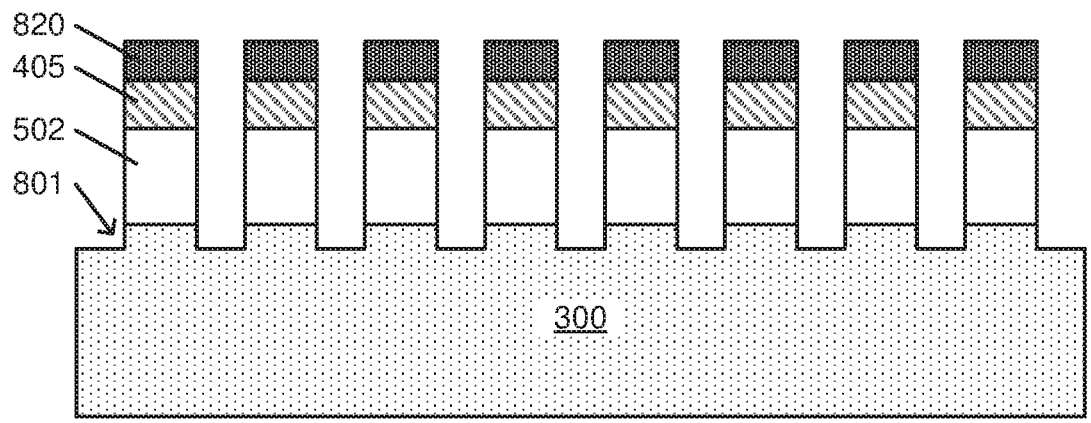

FIG. 8B shows a substrate following FIG. 8A after operation 240 is repeated to replenish the vertical growth mask 820 without etching the partially etched target layer 308, or depositing vertical growth mask material such as tungsten on sidewalk of the patterned BARC layer 405, and patterned DARC layer 502 or on the surface of the partially etched target layer 308.

Figure 8C:
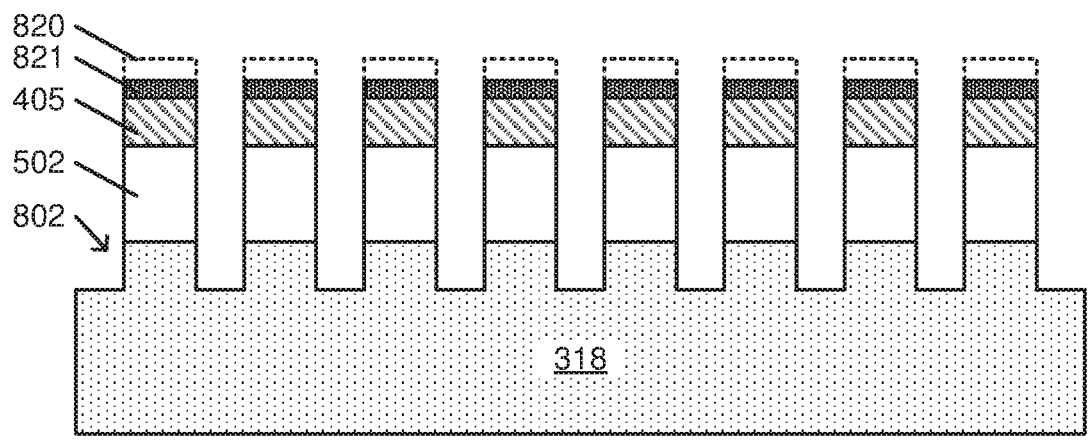

FIG. 8C shows a substrate following FIG. 8B after operation 260 is repeated to further etch the partially etched target layer 308 to form additionally etched target layer 318 such that additional thickness is removed such as shown at arrow 802. Etching may also further remove some of the replenished vertical growth mask 820 to form further etched vertical growth mask 821. Operations 240 and 260 can be repeated alternately in cycles to continue etching of the target layer while replenishing the vertical growth mask. In some embodiments, the vertical growth mask is deposited to a sufficient thickness such that redeposition of the vertical growth mask is not performed. In some embodiments, the vertical growth mask is deposited to a. thickness such that redeposition of the vertical growth mask is performed only once per thickness of the target layer etched which can vary depending on the composition and the thickness of the vertical growth mask deposited. In some embodiments, it may be possible to deposit a thick vertical growth mask, followed by etching of the target layer without having to redeposit additional vertical growth mask, particularly if the etching chemistry is highly selective to etching the target layer relative to the vertical growth mask materials.

Various embodiments described herein can be used for a variety of applications, including extreme ultraviolet (EUV) patterning, 3D NAND mask etching such as etching of carbon-containing materials or doped carbon-containing materials, and punch applications. One example of a punch application is a process for etching a high aspect ratio hole and trench pattern to "punch" the target film at bottom of the hole or trench, with minimum loss of the film at top of the feature. Some examples provided herein for etching a carbon-containing layer on a stack having BARC and DARC layers may be relevant to EUV patterning processes.

Apparatus inductively coupled plasma (ICP) reactors which, in certain embodiments, may be suitable for performing certain disclosed embodiments, including both deposition of vertical mask and etching of a target layer using the vertical mask. Such ICP reactors have also described in U.S. Patent Application Publication No. 2014/0170853, filed Dec. 10, 2013, and titled "IMAGE REVERSAL WITH AHM GAP FILL FOR MULTIPLE PATTERNING," hereby incorporated by reference in its entirety and for all purposes. Although ICP reactors are described herein, in some embodiments, it should be understood that capacitively coupled plasma reactors may also be used.

Figure 9:
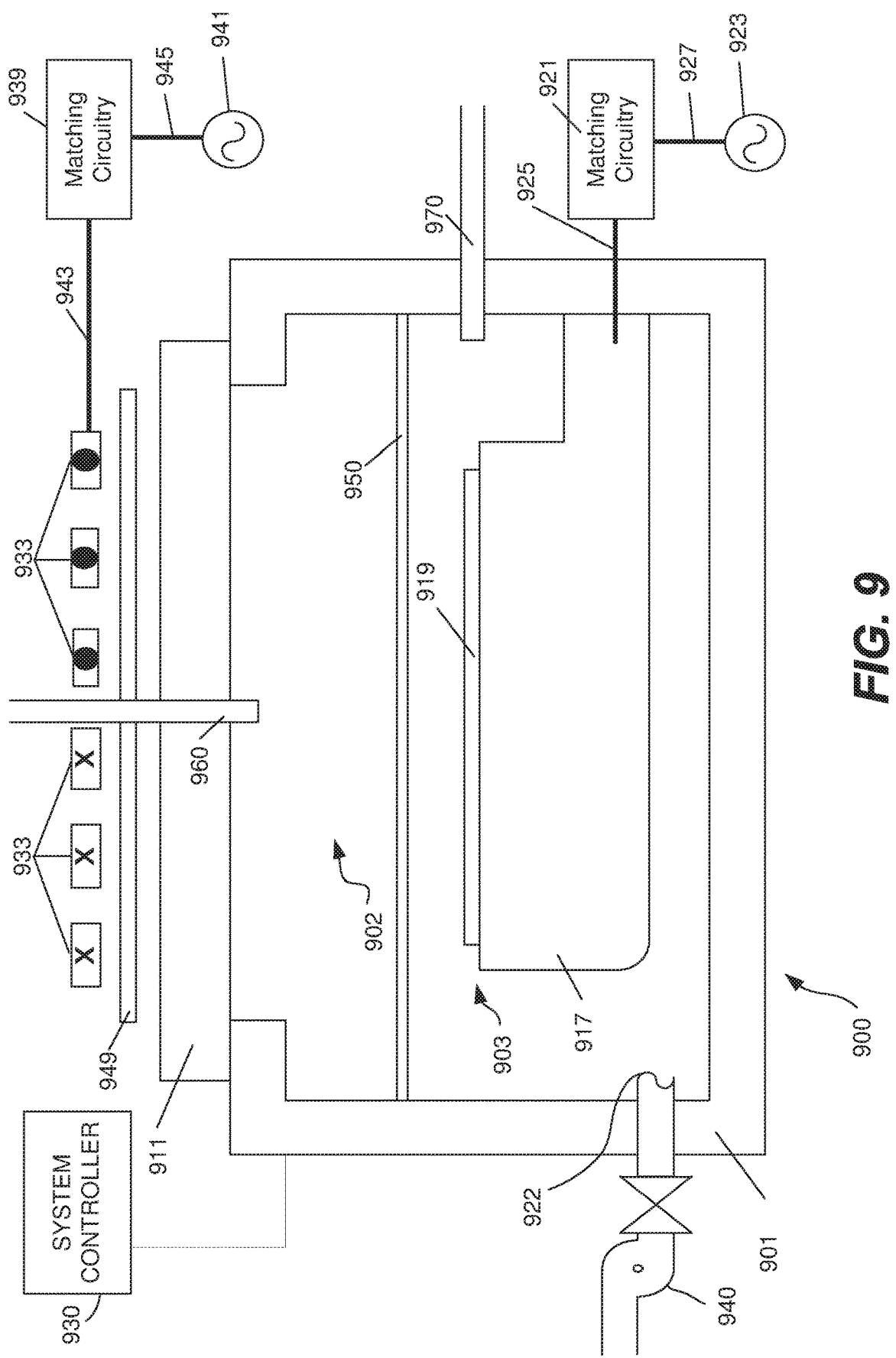
FIG. 9 is a schematic diagram of an example process chamber for performing certain disclosed embodiments.

FIG. 9 schematically shows a cross-sectional view of an inductively coupled plasma integrated etching and deposition apparatus 900 appropriate for implementing certain embodiments herein, an example of which is a Kiyo™ reactor, produced by Lam Research Corp. of Fremont, Calif. The inductively coupled plasma apparatus 900 includes an overall process chamber 901 structurally defined by chamber walls 901 and a window 911. The chamber walls 901 may be fabricated from stainless steel or aluminum. The window 911 may be fabricated from quartz or other dielectric material. An optional internal plasma grid 950 divides the overall processing chamber 901 into an upper sub-chamber 902 and a lower sub-chamber 903. In most embodiments, plasma grid 950 may be removed, thereby utilizing a chamber space made of sub-chambers 902 and 903. A chuck 917 is positioned within the lower sub-chamber 903 near the bottom inner surface. The chuck 917 is configured to receive and hold a semiconductor wafer 919 upon which the etching and deposition processes are performed. The chuck 917 can be an electrostatic chuck for supporting the wafer 919 when present. In some embodiments, an edge ring (not shown) surrounds chuck 917, and has an upper surface that is approximately planar with a top surface of a wafer 919, when present over chuck 917. The chuck 917 also includes electrostatic electrodes for chucking and dechucking the wafer. A filter and DC clamp power supply (not shown) may be provided for this purpose. Other control systems for lifting the wafer 919 off the chuck 917 can also be provided. The chuck 917 can be electrically charged using an RF power supply 923. The RF power supply 923 is connected to matching circuitry 921 through a connection 927. The matching circuitry 921 is connected to the chuck 917 through a connection 925. In this manner, the RF power supply 923 is connected to the chuck 917.

Elements for plasma generation include a coil 933 is positioned above window 911. In some embodiments, a coil is not used in disclosed embodiments. The coil 933 is fabricated from an electrically conductive material and includes at least one complete turn. The example of a coil 933 shown in FIG. 9 includes three turns. The cross-sections of coil 933 are shown with symbols, and coils having an "X" extend rotationally into the page, while coils having a "•" extend rotationally out of the page. Elements for plasma generation also include an RF power supply 941 configured to supply RF power to the coil 933. In general, the RF power supply 941 is connected to matching circuitry 939 through a connection 945. The matching circuitry 939 is connected to the coil 933 through a connection 943. In this manner, the RF power supply 941 is connected to the coil 933. An optional Faraday shield 949 is positioned between the coil 933 and the window 911. The Faraday shield 949 is maintained in a spaced apart relationship relative to the coil 933. The Faraday shield 949 is disposed immediately above the window 911. The coil 933, the Faraday shield 949, and the window 911 are each configured to be substantially parallel to one another. The Faraday shield may prevent metal or other species from depositing on the dielectric window of the plasma chamber 901.

Process gases (e.g. metal halides such as tungsten hexafluoride, argon, hydrogen, fluorocarbons, etc.) may be flowed into the processing chamber 901 through one or more main gas flow inlets 960 positioned in the upper chamber 902 and/or through one or more side gas flow inlets 970. Likewise, though not explicitly shown, similar gas flow inlets may be used to supply process gases to a capacitively coupled plasma processing chamber. A vacuum pump, e.g., a one or two stage mechanical dry pump and/or turbomolecular pump 940, may be used to draw process gases out of the process chamber 901 and to maintain a pressure within the process chamber 901. For example, the pump may be used to evacuate the chamber 901 which may be used to purge the chamber, such as during scavenging operations to prevent halogen species from trimming or etching a mask. A valve-controlled conduit may be used to fluidically connect the vacuum pump to the processing chamber 901 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus, one or more process gases may be supplied through the gas flow inlets 960 and/or 970. In certain embodiments, process gas may be supplied only through the main gas flow inlet 960, or only through the side gas flow inlet 970. In some cases, the gas flow inlets shown in the figure may be replaced more complex gas flow inlets, one or more showerheads, for example. The Faraday shield 949 and/or optional grid 950 may include internal channels and holes that allow delivery of process gases to the chamber 901. Either or both of Faraday shield 949 and optional grid 950 may serve as a showerhead for delivery of process gases. In some embodiments, a liquid vaporization and delivery system may be situated upstream of the chamber 901, such that once a liquid reactant or precursor is vaporized, the vaporized reactant or precursor is introduced into the chamber 901 via a gas flow inlet 960 and/or 970.

Radio frequency power is supplied from the RF power supply 941 to the coil 933 to cause an RF current to flow through the coil 933. The RF current flowing through the coil 933 generates an electromagnetic field about the coil 933. The electromagnetic field generates an inductive current within the upper sub-chamber 902. The physical and chemical interactions of various generated ions and radicals with the wafer 919 selectively etch features of and deposit layers on the wafer.

If the plasma grid is used such that there is both an upper sub-chamber 902 and a lower sub-chamber 903, the inductive current acts on the gas present in the upper sub-chamber 902 to generate an electron-ion plasma in the upper sub-chamber 902. The optional internal plasma grid 950 limits the amount of hot electrons in the lower sub-chamber 903. In some embodiments, the apparatus is designed and operated such that the plasma present in the lower sub-chamber 903 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower-sub-chamber 903 through port 922. The chuck 917 disclosed herein may operate at elevated temperatures ranging between about 10° C. and about 250° C. The temperature will depend on the process operation and specific recipe.

Chamber 901 may be coupled to facilities (not shown) when installed in a clean room or a fabrication facility. Facilities include plumbing that provide processing gases, vacuum, temperature control, and environmental particle control. These facilities are coupled to chamber 901, when installed in the target fabrication facility. Additionally, chamber 901 may be coupled to a transfer chamber that allows robotics to transfer semiconductor wafers into and out of chamber 901 using typical automation.

In some embodiments, a system controller 930 (which may include one or more physical or logical controllers) controls some or all of the operations of a processing chamber. The system controller 930 may include one or more memory devices and one or more processors. In some embodiments, the apparatus includes a switching system for controlling flow rates and durations when disclosed embodiments are performed. In some embodiments, the apparatus may have a switching time of up to about 500 ms, or up to about 750 ms. Switching time may depend on the flow chemistry, recipe chosen, reactor architecture, and other factors.

In some implementations, a controller 930 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 930, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 930 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 930, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 930 receives instructions in the form of data, which specify parameters for each of the processing steps to be performed during one or more operations. It should be understood that the parameters may be specific to the type of process to be performed and the type of tool that the controller is configured to interface with or control. Thus as described above, the controller 930 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber, Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 10:
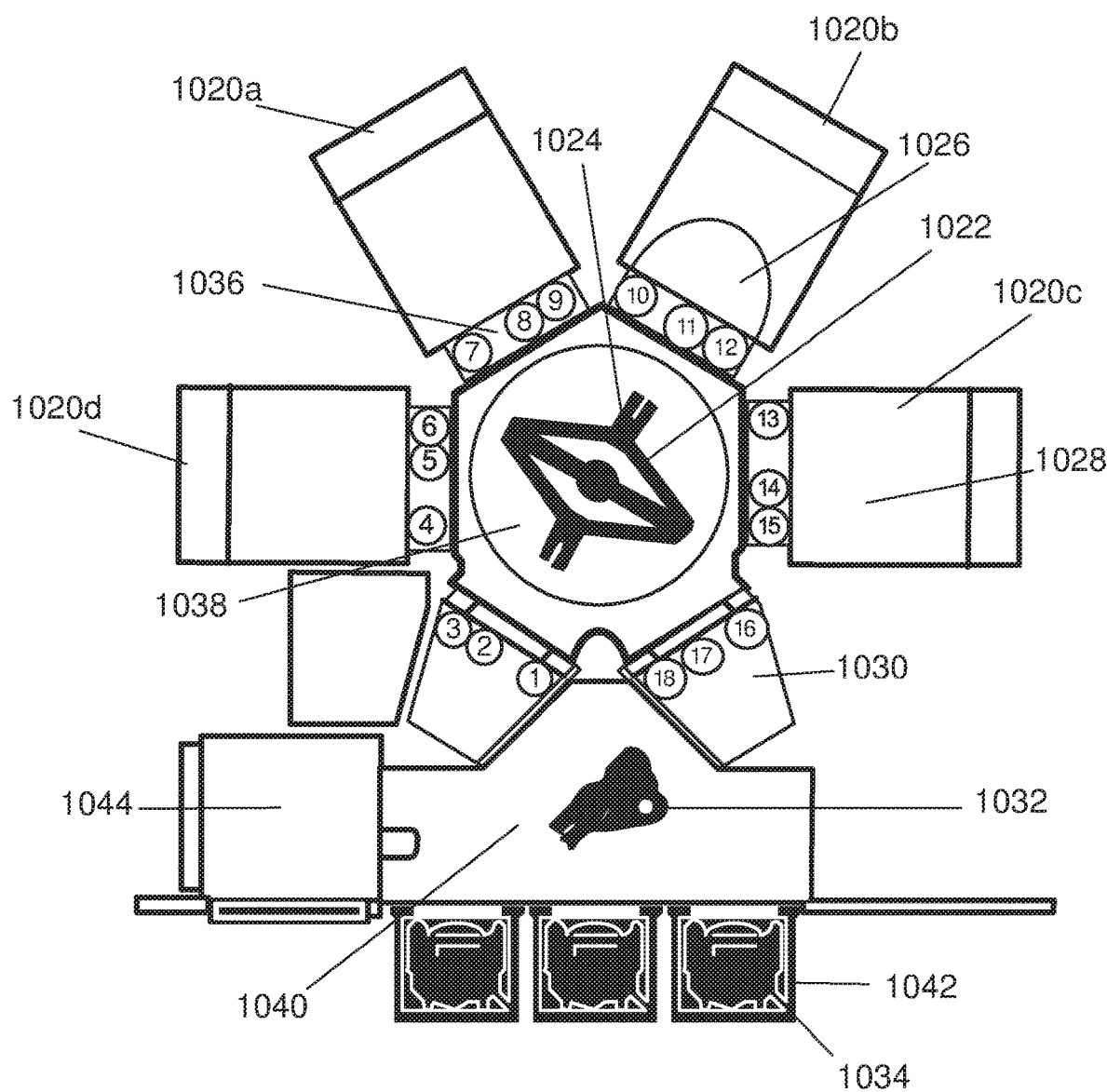
FIG. 10 is a schematic diagram of an example process apparatus for performing certain disclosed embodiments.

FIG. 10 depicts a semiconductor process cluster architecture with various modules that interface with a vacuum transfer module 1038 (VTM). The arrangement of transfer modules to "transfer" wafers among multiple storage facilities and processing modules may be referred to as a "cluster tool architecture" system. Airlock 1030, also known as a loadlock or transfer module, is shown in VTM 1038 with four processing modules 1020a-1020d, which may be individual optimized to perform various fabrication processes. By way of example, processing modules 1020a-1020d may be implemented to perform substrate etching, deposition, ion implantation, wafer cleaning, sputtering, and/or other semiconductor processes. In some embodiments, any of deposition of a vertical mask, and etching of a patterned etch mask, and etching of a target layer are performed in the same module. In some embodiments, any of deposition of a vertical mask, and etching of a patterned etch mask, and etching of a target layer are performed in different modules of the same tool. One or more of the substrate etching processing modules (any of 1020a-1020d) may be implemented as disclosed herein, i.e., for any of deposition of a vertical mask, and etching of a patterned etch mask, and etching of a target layer, and other suitable functions in accordance with the disclosed embodiments. Airlock 1030 and process module 1020 may be referred to as "stations." Each station has a facet 1036 that interfaces the station to VTM 1038. Inside each facet, sensors 1-18 are used to detect the passing of wafer 1026 when moved between respective stations.

Robot 1022 transfers wafer 1026 between stations. In one embodiment, robot 1022 has one arm, and in another embodiment, robot 1022 has two arms, where each arm has an end effector 1024 to pick wafers such as wafer 1026 for transport. Front-end robot 1032, in atmospheric transfer module (ATM) 1040, is used to transfer wafers 1026 from cassette or Front Opening Unified Pod (FOUP) 1034 in Load Port Module (LPM) 1042 to airlock 1030. Module center 1028 inside process module 1020 is one location for placing wafer 1026. Aligner 1044 in ATM 1040 is used to align wafers.

In an exemplary processing method, a wafer is placed in one of the FOUPs 1034 in the LPM 1042. Front-end robot 1032 transfers the wafer from the FOUP 1034 to an aligner 1044, which allows the wafer 1026 to be properly centered before it is etched or processed. After being aligned, the wafer 1026 is moved by the front-end robot 1032 into an airlock 1030. Because airlock modules have the ability to match the environment between an ATM and a VIM, the wafer 1026 is able to move between the two pressure environments without being damaged. From the airlock module 1030, the wafer 1026 is moved by robot 1022 through VTM 1038 and into one of the process modules 1020a-1020d. In order to achieve this wafer movement, the robot 1022 uses end effectors 1024 on each of its arms. Once the wafer 1026 has been processed, it is moved by robot 1022 from the process modules 1020a-1020d to an airlock module 1030. From here, the wafer 1026 may be moved by the front-end robot 1032 to one of the FOUPs 1034 or to the aligner 1044.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 9 may be implemented with the tool in FIG. 10.

The implementations disclosed herein describe deposition of a material on a substrate such as a wafer, substrate, or other work piece. The work piece may be of various shapes, sizes, and materials. In this application, the terms "semiconductor wafer," "wafer," "substrate," "wafer substrate," and "partially fabricated integrated circuit" are used interchangeably. One of ordinary skill in the art would understand that the term "partially fabricated integrated circuit"

can refer to a silicon wafer during any of many stages of integrated circuit fabrication thereon.

Conclusion

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
providing a semiconductor substrate comprising a carbon-containing target layer, an anti-reflective layer, and a patterned photoresist;
patterning the anti-reflective layer to form a patterned anti-reflective mask;
exposing the semiconductor substrate to a tungsten-containing precursor and igniting a plasma under conditions to selectively deposit a tungsten-containing mask to form a patterned tungsten-containing mask on field regions of the patterned anti-reflective mask; and
patterning the carbon-containing target layer using the patterned anti-reflective mask and patterned tungsten-containing mask.

2. The method of claim 1, wherein the formation of the patterned tungsten-containing mask and the patterning the carbon-containing target layer are performed simultaneously.

3. The method of claim 1, wherein the formation of the patterned tungsten-containing mask and the patterning the carbon-containing target layer are performed in a cycle.

4. The method of claim 1, wherein the depositing of the tungsten-containing mask comprises using one or more cycles of (i) a pulse of a first gas and (ii) a pulse of a mixture of second and third gases.

5. The method of claim 4, wherein the first gas comprises the tungsten-containing precursor, and the mixture of second and third gases comprises a mixture of argon and hydrogen gas.

6. The method of claim 4, further comprising selecting a quantity of the one or more cycles based on a duration of the pulse of the first gas, a duration of the pulse of the mixture of second and third gases, a desired thickness of the tungsten-containing mask, or a combination thereof.

7. A method comprising:
providing a semiconductor substrate comprising a carbon-containing target layer and a patterned etch mask having a first critical dimension;
exposing the semiconductor substrate to plasma generated using a plasma power between about 100W and about 500W from one or more pulses of a tungsten-containing precursor and one or more pulses of a mixture of argon and hydrogen gas at a substrate temperature less than about 160° C. to form tungsten material having a second critical dimension on the patterned etch mask, and
patterning the carbon-containing target layer using the patterned etch mask and the tungsten material;
wherein the second critical dimension is within 150% of the first critical dimension.

8. The method of claim 7, wherein the one or more pulses of the mixture of argon and hydrogen gas comprise a duration of between about 100 milliseconds and about 10 seconds.

9. The method of claim 7, wherein the one or more pulses of a tungsten-containing precursor comprise a duration of between about 100 milliseconds and about 10 seconds.

10. The method of claim 7, wherein the formation of the tungsten material and the patterning of the carbon-containing target layer are performed simultaneously.

11. The method of claim 7, wherein the formation of the tungsten material and the patterning of the carbon-containing target layer are performed in a cycle.

12. The method of claim 7, wherein the one or more pulses of the tungsten-containing precursor and the one or more pulses of the mixture of argon and hydrogen gas comprise a plurality of alternating pulses of the tungsten-containing precursor and the mixture of argon and hydrogen gas.

13. The method of claim 12, wherein the plurality of alternating pulses comprise a quantity of cycles selected based on a duration of each of the plurality of alternating pulses of the tungsten-containing precursor and the mixture of argon and hydrogen gas, a desired thickness of the tungsten material, or a combination thereof.

14. The method of claim 13, wherein the quantity of cycles is between about 3 cycles and about 20 cycles.

* * * * *